US010291356B2

(12) United States Patent
Nammi et al.

(10) Patent No.: US 10,291,356 B2
(45) Date of Patent: May 14, 2019

(54) DECODING PROCEDURES IN SYSTEMS WITH CODEBLOCK SEGMENTATION

(71) Applicant: Futurewei Technologies, Inc., Plano, TX (US)

(72) Inventors: SaiRamesh Nammi, Bedminster, NJ (US); Xiao-Feng Qi, Westfield, NJ (US)

(73) Assignee: Futurewei Technologies, Inc., Plano, TX (US)

( * ) Notice: Subject to any disclaimer, the term of this patent is extended or adjusted under 35 U.S.C. 154(b) by 71 days.

(21) Appl. No.: 15/151,809

(22) Filed: May 11, 2016

(65) Prior Publication Data

US 2017/0331591 A1   Nov. 16, 2017

(51) Int. Cl.
*H04L 1/00* (2006.01)
*H04L 5/00* (2006.01)
(Continued)

(52) U.S. Cl.
CPC .......... *H04L 1/0061* (2013.01); *H04L 1/0041* (2013.01); *H04L 1/0045* (2013.01);
(Continued)

(58) Field of Classification Search
CPC ... H04L 1/0061; H04L 5/0055; H04L 1/0041; H04L 1/0045; H04L 69/324;
(Continued)

(56) References Cited

U.S. PATENT DOCUMENTS

| 8,839,079 B2 * | 9/2014 | Chen | H04L 1/0051 |
| | | | 714/780 |
| 2008/0225965 A1 * | 9/2008 | Pi | H04L 1/0003 |
| | | | 375/260 |

(Continued)

FOREIGN PATENT DOCUMENTS

| CN | 104683073 A | 6/2015 |
| CN | 102904673 B | 8/2015 |
| WO | 2015120051 A1 | 8/2015 |

OTHER PUBLICATIONS

PCT/CN2017/083796, ISR, dated Jul. 10, 2017.

*Primary Examiner* — Albert Decady
*Assistant Examiner* — Osman M Alshack
(74) *Attorney, Agent, or Firm* — Vierra Magen Marcus LLP

(57) ABSTRACT

The disclosure relates to a method for decoding a transport block encoded with multiple codeblock segments. User equipment determines whether to decode one of a transport block cyclic redundancy check (CRC) and a codeblock segment CRC based on a speed of user equipment. In response to the speed of the user equipment being greater than a threshold, the user equipment decodes the transport block CRC and generates an acknowledgement (ACK)/non-acknowledgement (NAK). In response to the speed of the UE being less than or equal to the threshold, during a first data transmission, the user equipment decodes the codeblock segment CRC for each of the multiple codeblock segments and generates the ACK/NAK. During a second (Continued)

and latter data transmissions, the user equipment decodes the codeblock segment CRC for each of the multiple codeblock segments that failed in the first data transmission and generates the ACK/NAK.

21 Claims, 11 Drawing Sheets

(51) Int. Cl.
    *H04L 29/08*     (2006.01)
    *G06F 11/10*     (2006.01)
    *H03M 13/43*     (2006.01)

(52) U.S. Cl.
    CPC .......... *H04L 5/0055* (2013.01); *H04L 69/324* (2013.01); *G06F 11/1004* (2013.01); *H03M 13/43* (2013.01); *H04L 5/0091* (2013.01)

(58) Field of Classification Search
    CPC ............... H04L 61/3075; H03M 13/43; G11C 29/50004; G06F 11/1004; G11B 20/1833; G11B 2020/1843
    USPC ......... 714/721, 748, 758, 760, 776
    See application file for complete search history.

(56) References Cited

U.S. PATENT DOCUMENTS

| | | | |
|---|---|---|---|
| 2008/0310352 A1 | 12/2008 | McBeath | |
| 2009/0019337 A1* | 1/2009 | Pi | H04L 1/004 714/758 |
| 2009/0077456 A1* | 3/2009 | Pi | H03M 13/09 714/807 |
| 2009/0077457 A1* | 3/2009 | Ramesh | H03M 13/2975 714/807 |
| 2010/0223534 A1* | 9/2010 | Earnshaw | H03M 13/1505 714/780 |
| 2011/0075611 A1* | 3/2011 | Choi | H04L 1/1819 370/329 |
| 2015/0237672 A1* | 8/2015 | Kanamarlapudi | H04W 76/046 370/329 |
| 2016/0294512 A1* | 10/2016 | Noh | H04L 1/0045 |

* cited by examiner

DECODING PROCEDURES IN SYSTEMS WITH CODEBLOCK SEGMENTATION

BACKGROUND

With advances in technology, mobile communication systems include wireless data packet communication systems of high speed and high quality. Such communication systems provide data service and multimedia service, beyond the initial voice-oriented services. The development of High Speed Downlink Packet Access (HSDPA), which progressed as part of the $3^{rd}$ Generation Partnership Project (3GPP), can be viewed as a representative effort for providing a wireless data packet transport service having high quality at over 2 Mbps in the 3G mobile communication system.

In a 3GPP long term evolution (3GPP LTE) system, when a transport block is large, the transport block is segmented into multiple codeblocks so that multiple coded packets can be generated, which is advantageous because of benefits such as enabling parallel processing or data pipelining and to facilitate flexibility with respect to trade-offs between power consumption and hardware complexity.

In a contemporary High Speed Data Shared Channel (HS-DSCH) design, only one 24-bit cyclic redundancy check (CRC) is generated for the whole transport block for the purpose of error detection for that block. If multiple codeblocks are generated and transmitted in one transmission time interval (TTI), the receiver may correctly decode some of the codeblocks but not the others. In that case, the receiver will generate a non-acknowledgement (NAK) feedback message to the transmitter because the CRC for the transport block did not pass the check.

BRIEF SUMMARY

In one embodiment, the present technology relates to a method for decoding a transport block encoded with multiple codeblock segments, comprising receiving, at a receiver, the transport block which includes one of a transport block cyclic redundancy check (CRC) and a codeblock segment CRC; determining whether to decode one of a transport block cyclic redundancy check (CRC) and a codeblock segment CRC based on a speed of user equipment; in response to the speed of the user equipment being greater than a threshold, the user equipment decoding the transport block CRC and generating an acknowledgement (ACK)/non-acknowledgement (NAK); and in response to the speed of the UE being less than or equal to the threshold, for a first data transmission, the user equipment decoding the codeblock segment CRC for each of the multiple codeblock segments and generating the ACK/NAK; and for second and latter data transmissions, the user equipment decoding the codeblock segment CRC for each of the multiple codeblock segments that failed in the first data transmission and generating the ACK/NAK.

In another embodiment, the present technology relates to a non-transitory computer-readable medium storing computer instructions for receiving and decoding a transport block encoded with multiple codeblock segments, that when executed by one or more processors, causes the one or more processors to perform the steps of: determining whether to decode one of a transport block cyclic redundancy check (CRC) and a codeblock segment CRC based on a speed of user equipment; in response to the speed of the user equipment being greater than a threshold, the user equipment decoding the transport block CRC and generating an acknowledgement (ACK)/non-acknowledgement (NAK); and in response to the speed of the UE being less than or equal to the threshold, for a first data transmission, the user equipment decoding the codeblock segment CRC for each of the multiple codeblock segments and generating the ACK/NAK; and for second and latter data transmissions, the user equipment decoding the codeblock segment CRC for each of the multiple codeblock segments that failed in the first data transmission and generating the ACK/NAK.

In still another embodiment, the present technology relates to user equipment for decoding a transport block encoded with multiple codeblock segments, comprising a memory storage comprising instructions; and one or more processors coupled to the memory that execute the instructions to receive, at a receiver, the transport block which includes one of a transport block cyclic redundancy check (CRC) and a codeblock segment CRC; determine whether to decode one of a transport block cyclic redundancy check (CRC) and a codeblock segment CRC based on a speed of user equipment; in response to the speed of the user equipment being greater than a threshold, decode the transport block CRC and generating an acknowledgement (ACK)/non-acknowledgement (NAK); and in response to the speed of the UE being less than or equal to the threshold, for a first data transmission, decode the codeblock segment CRC for each of the multiple codeblock segments and generating the ACK/NAK; and for second and latter data transmissions, decode the codeblock segment CRC for each of the multiple codeblock segments that failed in the first data transmission and generating the ACK/NAK.

In yet another embodiment, there is a user equipment for decoding a transport block encoded with multiple codeblock segments, comprising means for receiving the transport block which includes one of a transport block cyclic redundancy check (CRC) and a codeblock segment CRC; means for determining whether to decode one of a transport block cyclic redundancy check (CRC) and a codeblock segment CRC based on a speed of user equipment; in response to the speed of the user equipment being greater than a threshold, means for decoding the transport block CRC and generating an acknowledgement (ACK)/non-acknowledgement (NAK); and in response to the speed of the UE being less than or equal to the threshold, for a first data transmission, means for decoding the codeblock segment CRC for each of the multiple codeblock segments and generating the ACK/NAK; and for second and latter data transmissions, means for decoding the codeblock segment CRC for each of the multiple codeblock segments that failed in the first data transmission and generating the ACK/NAK.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the Background.

BRIEF DESCRIPTION OF THE DRAWINGS

Aspects of the present disclosure are illustrated by way of example and are not limited by the accompanying figures for which like references indicate like elements.

DETAILED DESCRIPTION

The present technology, generally described, relates to technology for decoding data transmissions received at a terminal, and in particular, to decoding transport blocks with a CRC having codeblock segmentation.

Current 3GPP standards do not specify how to decode a transport block at the receiver (e.g., at the UE). That is, current standards do not specify whether to decode a codeblock segment CRC or a transport block CRC to generate a hybrid automatic repeat request—acknowledgement (HARQ-ACK) for the transport block. This creates an ambiguity in decoding the transport block for the receiver, which is of particular concern when the transport block consists of many codeblock segments (typical, for example, with 4×4 and 8×8 multiple-input multiple-output (MIMO) systems with high signal to noise ratio (SNR)) or other metrics that indicate good signal quality.

In the present technology, a transport block encoded with multiple codeblock segments is received by the UE. Upon receipt, the transport block is decoded based on the speed of the UE and a HARQ-ACK is reported back to the base station. The UE reports the HARQ-ACK based on the transport block CRC for slow speed UEs, and reports the HARQ-ACK by checking the CRC of the codeblock segments for high speed UEs, such that the UE utilizes passed codeblock segments (i.e., codeblock segments passing the CRC) from prior transmissions to generate the HARQ-ACK of the transport block. Decoding the transport block according to this process reduces the number of transmission at the base station and reduces processing and energy consumption at the UE.

It is understood that the present embodiments of the invention may be implemented in many different forms and should not be construed as being limited to the embodiments set forth herein. Rather, these embodiments are provided so that this disclosure will be thorough and complete and will fully convey the invention to those skilled in the art. Indeed, the described embodiments of the invention are intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details or with equivalent implementations.

Figure 1:
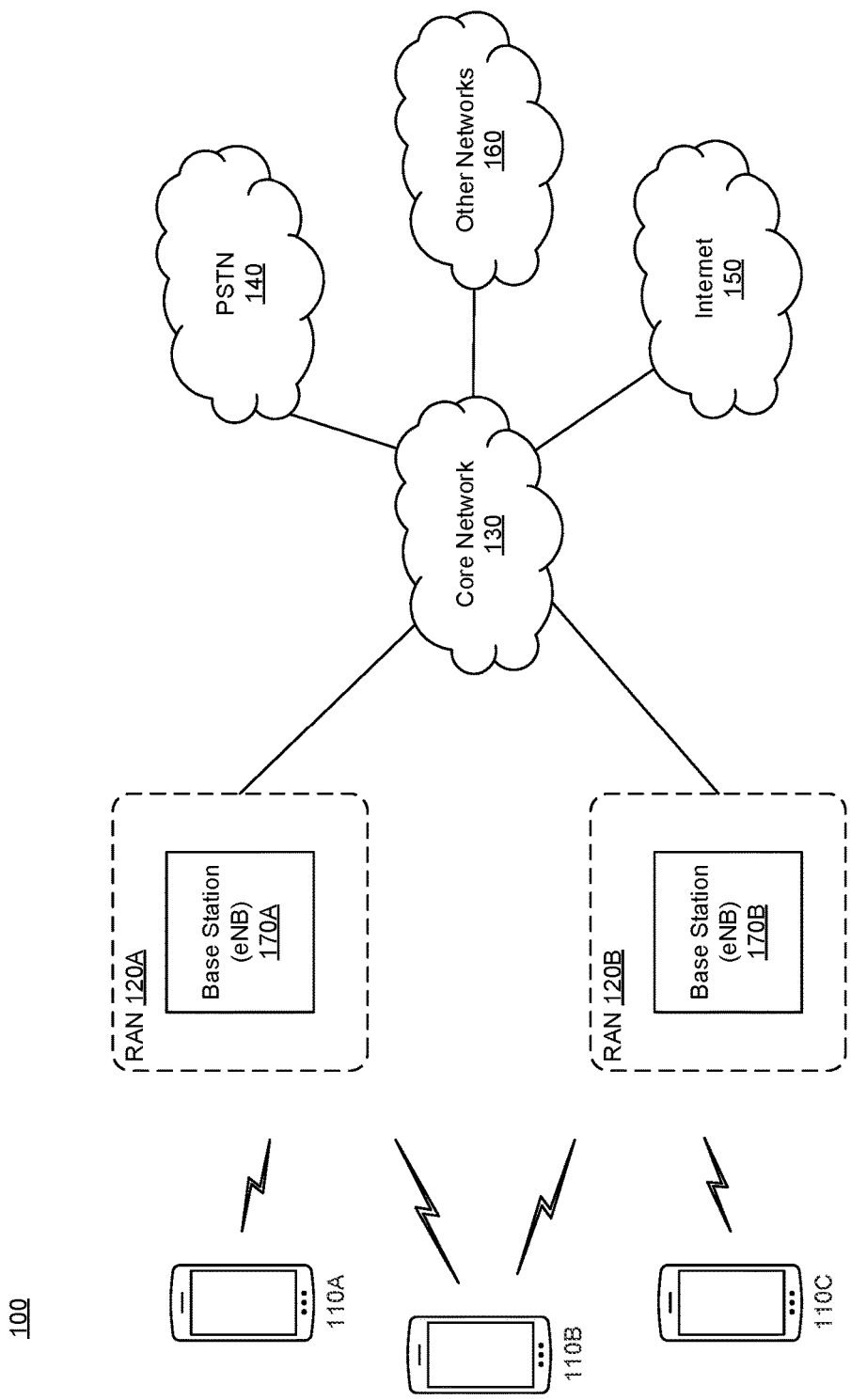
FIG. 1 illustrates a wireless network for communicating data.

FIG. 1 illustrates a wireless network for communicating data. The communication system 100 includes, for example, UE 110A-110C, radio access networks (RANs) 120A-120B, a core network 130, a public switched telephone network (PSTN) 140, the Internet 150, and other networks 160. Additional or alternative networks include private and public data-packet networks including corporate intranets. While certain numbers of these components or elements are shown in the figure, any number of these components or elements may be included in the system 100.

System 100 enables multiple wireless users to transmit and receive data and other content. The system 100 may implement one or more channel access methods, such as but not limited to code division multiple access (CDMA), time division multiple access (TDMA), frequency division multiple access (FDMA), orthogonal FDMA (OFDMA), or single-carrier FDMA (SC-FDMA).

The UEs 110A-110C are configured to operate and/or communicate in the system 100. For example, the UEs 110A-110C are configured to transmit and/or receive wireless signals or wired signals. Each UE 110A-110C represents any suitable end user device and may include such devices (or may be referred to) as a user equipment/device (UE), wireless transmit/receive unit (WTRU), mobile station, fixed or mobile subscriber unit, pager, cellular telephone, personal digital assistant (PDA), smartphone, laptop, computer, touchpad, wireless sensor, or consumer electronics device.

In the depicted embodiment, the RANs 120A-120B include one or more base stations 170A, 170B (collectively, base stations 170), respectively. Each of the base stations 170 is configured to wirelessly interface with one or more of the UEs 110A, 110B, 110C (collectively, UEs 110) to enable access to the core network 130, the PSTN 140, the Internet 150, and/or the other networks 160. For example, the base stations (BSs) 170 may include one or more of several well-known devices, such as a base transceiver station (BTS), a Node-B (NodeB), an evolved NodeB (eNB), a Home NodeB, a Home eNodeB, a site controller, an access point (AP), or a wireless router, or a server, router, switch, or other processing entity with a wired or wireless network.

In one embodiment, the base station 170A forms part of the RAN 120A, which may include other base stations, elements, and/or devices. Similarly, the base station 170B forms part of the RAN 120B, which may include other base stations, elements, and/or devices. Each of the base stations 170 operates to transmit and/or receive wireless signals within a particular geographic region or area, sometimes referred to as a "cell." In some embodiments, multiple-input multiple-output (MIMO) technology may be employed having multiple transceivers for each cell.

The base stations 170 communicate with one or more of the UEs 110 over one or more air interfaces (not shown) using wireless communication links. The air interfaces may utilize any suitable radio access technology.

It is contemplated that the system 100 may use multiple channel access functionality, including for example schemes in which the base stations 170 and UEs 110 are configured to implement the Long Term Evolution wireless communication standard (LTE), LTE Advanced (LTE-A), and/or LTE Broadcast (LTE-B). In other embodiments, the base stations 170 and UEs 110 are configured to implement UMTS, HSPA, or HSPA+ standards and protocols. Of course, other multiple access schemes and wireless protocols may be utilized.

The RANs 120A-120B are in communication with the core network 130 to provide the UEs 110 with voice, data, application, Voice over Internet Protocol (VoIP), or other services. As appreciated, the RANs 120A-120B and/or the core network 130 may be in direct or indirect communication with one or more other RANs (not shown). The core network 130 may also serve as a gateway access for other networks (such as PSTN 140, Internet 150, and other networks 160). In addition, some or all of the UEs 110 may include functionality for communicating with different wireless networks over different wireless links using different wireless technologies and/or protocols.

In one embodiment, the base stations 170 comprise a carrier aggregation component (not shown) that is configured to provide service for a plurality of UEs 110 and, more specifically, to select and allocate carriers as aggregated carriers for a UE 110. More specifically, the carrier configuration component of base stations 170 may be configured to receive or determine a carrier aggregation capability of a selected UE 110. The carrier aggregation component operating at the base stations 170 are operable to configure a plurality of component carriers at the base stations 170 for the selected UE 110 based on the carrier aggregation capability of the selected UE 110. Based on the selected UE(s) capability or capabilities, the base stations 170 are configured to generate and broadcast a component carrier configuration message containing component carrier configuration information that is common to the UEs 110 that specifies aggregated carriers for at least one of uplink and downlink communications.

In another embodiment, base stations 170 generate and transmit component carrier configuration information that is specific to the selected UE 110. Additionally, the carrier aggregation component may be configured to select or allocate component carriers for the selected UE 110 based on at least one of quality of service needs and bandwidth of the selected UE 110. Such quality of service needs and/or required bandwidth may be specified by the UE 110 or may be inferred by a data type or data source that is to be transmitted.

Although FIG. 1 illustrates one example of a communication system, various changes may be made to FIG. 1. For example, the communication system 100 could include any number of UEs, base stations, networks, or other components in any suitable configuration.

It is also appreciated that the term UE may refer to any type of wireless device communicating with a radio network node in a cellular or mobile communication system. Non-limiting examples of a UE are a target device, device-to-device (D2D) UE, machine type UE or UE capable of machine-to-machine (M2M) communication, PDA, iPAD, Tablet, mobile terminals, smart phone, laptop embedded equipped (LEE), laptop mounted equipment (LME) and USB dongles.

Moreover, while the embodiments are described in particular for downlink data transmission scheme in LTE based systems, they are equally applicable to any radio access technology (RAT) or multi-RAT system. The embodiments are also applicable to single carrier as well as to multicarrier (MC) or carrier aggregation (CA) operation of the UE in which the UE is able to receive and/or transmit data to more than one serving cells using MIMO.

Figure 2:
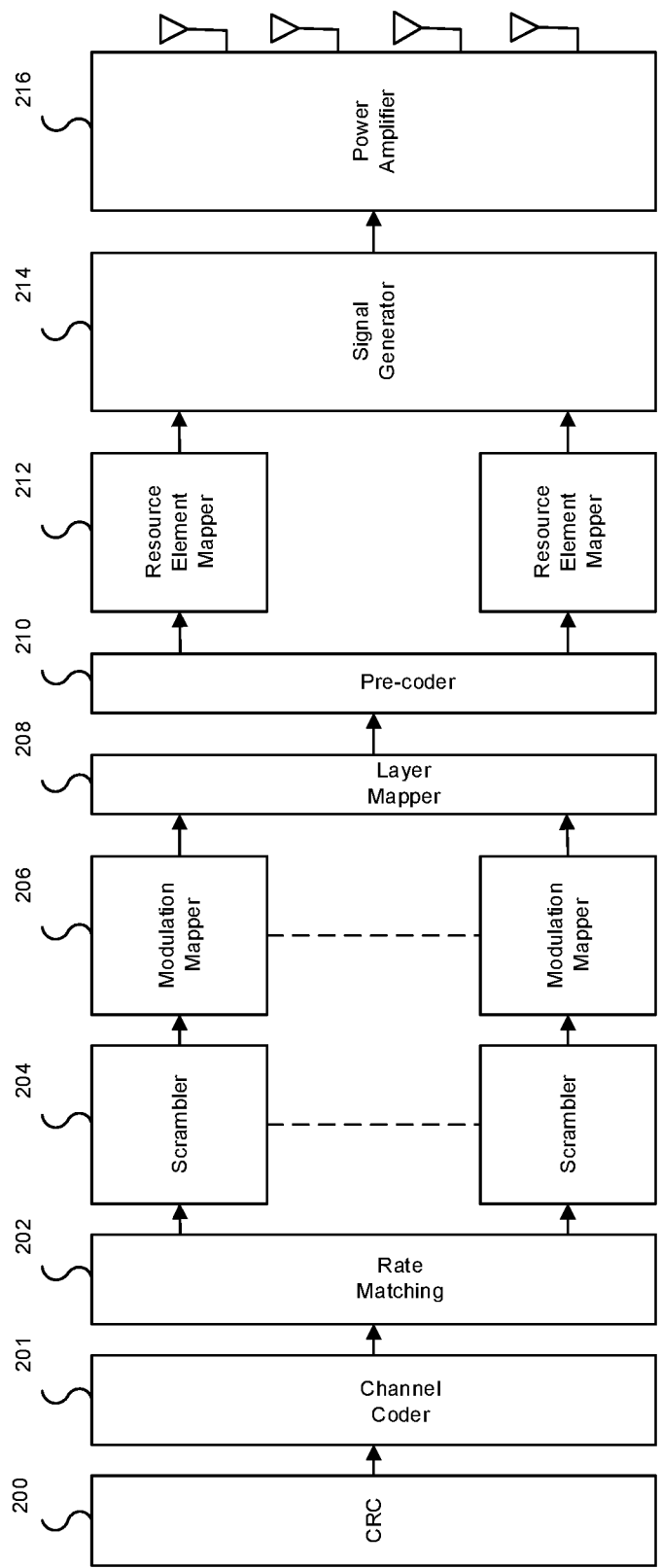
FIG. 2 illustrates an example of a physical layer diagram in accordance with an embodiment of the disclosure.

FIG. 2 illustrates an example of a physical layer diagram in accordance with an embodiment of the disclosure. Transport block data is passed through a cyclic redundancy check (CRC) 200 for error detection. The CRC 200 appends a CRC code to the transport block data received from a media access control (MAC) layer before being passed through the physical layer. The transport block is divided by a cyclic generator polynomial to generate parity bits. These parity bits are then appended to the end of transport block. A detailed description of transport block and code segmentation may be found in the description below with reference to FIG. 4.

The physical layer comprises a channel coder 201, a rate matcher 202, a scrambler 204, a modulation mapper 206, a layer mapper 208, a pre-coder 210, a resource element mapper 212, a signal generator (OFDMA) 214, and a power amplifier (PA) 216.

Channel coder 201 turbo codes the data with convolutional encoders having certain interleaving there-between, and the rate matcher 202 acts as a rate coordinator or buffer between preceding and succeeding transport blocks. The scrambler 204 produces a block of scrambled bits from the input bits.

Resource elements and resource blocks (RBs) define a physical channel. A RB is a collection of resource elements. A resource element is a single subcarrier over one OFDM symbol, and carries multiple modulated symbols with spatial multiplexing. In the frequency domain, a RB represents the smallest unit of resources that can be allocated. In LTE-A, a RB is a unit of time frequency resource, representing 180 KHz of spectrum bandwidth for the duration of a 0.5 millisecond slot.

Modulation mapper 206 maps the bit values of the input to complex modulation symbols with the modulation scheme specified. In one embodiment, the modulation scheme is Discrete Fourier Transform Spread Orthogonal Frequency Division Multiplexing (DFT-S-OFDM). In another embodiment, the modulation scheme is OFDM with aggressive PAPR reduction.

Spatial multiplexing creates multiple streams of data to individual UEs 110 on a single resource block (RB) effectively reusing each RB a number of times and thus increases spectral efficiency. Layer mapper 208 splits the data sequence into a number of layers.

Pre-coder 210 is based on transmit beam-forming concepts allowing multiple beams to be simultaneously transmitted in the M-MIMO system by a set of complex weighting matrices for combining the layers before transmission. Vector hopping is may be used for transmit diversity. The pre-coder 210 may, for example, vector hop with the weighting of the two antennas alternating between $[+1, +1]^T$ and $[+1, -1]^T$ from subframe to subframe, and resetting at the beginning of a new radio frame.

The resource element mapper 212 maps the data symbols, the reference signal symbols and control information symbols into a certain resource element in the resource grid. The signal generator 214 is coupled between the resource element mapper 212 and the PA array 216, such that a generated signal is transmitted by the PA antenna array using common broadcast channels (e.g. PSS, SSS, PBCH, PDCCH and PDSCH) over a narrow sub-band resource.

For example, LTE systems support transmission of a maximum of two codewords in the downlink channel, where a codeword is defined as an information block appended with a CRC. Each codeword is separately segmented and coded using turbo coding and the coded bits from each codeword are scrambled separately, as explained above. The complex-valued modulation symbols for each of the codewords to be transmitted are mapped onto one or multiple layers using layer mapper 208. The complex-valued modulation symbols $d^{(q)}(0), \ldots, d^{(q)}(M^{(q)}_{symb}-1)$ for codeword q are mapped onto the layers $x(i)=[x^{(0)}(i) \ldots x^{(u-1)}(i)]^T$, i=0, 1, ..., $M^{layer}_{symb}-1$, where u is the number of layers and $M^{layer}_{symb}$ is the number of modulation symbols per layer. The codeword to layer mapping is shown in Table 1 below.

Once the layer mapping is completed, the resultant symbols are pre-coded using the pre-coder 210. The pre-coded symbols are mapped to resource elements in the OFDM time frequency grid and the OFDM signal is generated at 214. The resulting signal is passed to the antenna ports.

TABLE 1

Codeword-to-Layer Mapping in LTE

| Number of layers | Number of codewords | Codeword-to-layer mapping i = 0, 1, ..., $M^{layer}_{symb}-1$ | |
|---|---|---|---|
| 1 | 1 | $x^{(0)}(i) = d^{(0)}(i)$ | $M^{layer}_{symb} = M^{(0)}_{symb}$ |
| 2 | 2 | $x^{(0)}(i) = d^{(0)}(i)$ | $M^{layer}_{symb} = M^{(0)}_{symb} = M^{(1)}_{symb}$ |
|   |   | $x^{(1)}(i) = d^{(1)}(i)$ |   |
| 3 | 2 | $x^{(0)}(i) = d^{(0)}(i)$ | $M^{layer}_{symb} = M^{(0)}_{symb} = M^{(1)}_{symb}/2$ |
|   |   | $x^{(1)}(i) = d^{(1)}(2i)$ |   |
|   |   | $x^{(2)}(i) = d^{(1)}(2i + 1)$ |   |
| 4 | 2 | $x^{(0)}(i) = d^{(0)}(2i)$ | $M^{layer}_{symb} = M^{(0)}_{symb}/2 = M^{(1)}_{symb}/2$ |
|   |   | $x^{(1)}(i) = d^{(0)}(2i+1)$ |   |
|   |   | $x^{(2)}(i) = d^{(1)}(2i)$ |   |
|   |   | $x^{(3)}(i) = d^{(1)}(2i + 1)$ |   |
| 5 | 2 | $x^{(0)}(i) = d^{(0)}(2i)$ | $M^{layer}_{symb} = M^{(0)}_{symb}/2 = M^{(1)}_{symb}/3$ |
|   |   | $x^{(1)}(i) = d^{(0)}(2i + 1)$ |   |
|   |   | $x^{(2)}(i) = d^{(1)}(3i)$ |   |
|   |   | $x^{(3)}(i) = d^{(1)}(3i + 1)$ |   |
|   |   | $x^{(4)}(i) = d^{(1)}(3i + 2)$ |   |
| 6 | 2 | $x^{(0)}(i) = d^{(0)}(3i)$ | $M^{layer}_{symb} = M^{(0)}_{symb}/3 = M^{(1)}_{symb}/3$ |
|   |   | $x^{(1)}(i) = d^{(0)}(3i + 1)$ |   |
|   |   | $x^{(2)}(i) = d^{(0)}(3i + 2)$ |   |
|   |   | $x^{(3)}(i) = d^{(1)}(3i)$ |   |
|   |   | $x^{(4)}(i) = d^{(1)}(3i + 1)$ |   |
|   |   | $x^{(5)}(i) = d^{(1)}(3i + 2)$ |   |
| 7 | 2 | $x^{(0)}(i) = d^{(0)}(3i)$ | $M^{layer}_{symb} = M^{(0)}_{symb}/3 = M^{(1)}_{symb}/4$ |
|   |   | $x^{(1)}(i) = d^{(0)}(3i + 1)$ |   |
|   |   | $x^{(2)}(i) = d^{(0)}(3i + 2)$ |   |
|   |   | $x^{(3)}(i) = d^{(1)}(4i)$ |   |
|   |   | $x^{(4)}(i) = d^{(1)}(4i + 1)$ |   |
|   |   | $x^{(5)}(i) = d^{(1)}(4i + 2)$ |   |
|   |   | $x^{(6)}(i) = d^{(1)}(4i + 3)$ |   |
| 8 | 2 | $x^{(0)}(i) = d^{(0)}(4i)$ | $M^{layer}_{symb} = M^{(0)}_{symb}/4 = M^{(1)}_{symb}/4$ |
|   |   | $x^{(1)}(i) = d^{(0)}(4i + 1)$ |   |
|   |   | $x^{(2)}(i) = d^{(0)}(4i + 2)$ |   |
|   |   | $x^{(3)}(i) = d^{(0)}(4i + 3)$ |   |
|   |   | $x^{(4)}(i) = d^{(1)}(4i)$ |   |
|   |   | $x^{(5)}(i) = d^{(1)}(4i + 1)$ |   |
|   |   | $x^{(6)}(i) = d^{(1)}(4i + 2)$ |   |
|   |   | $x^{(7)}(i) = d^{(1)}(4i + 3)$ |   |

Figure 3:
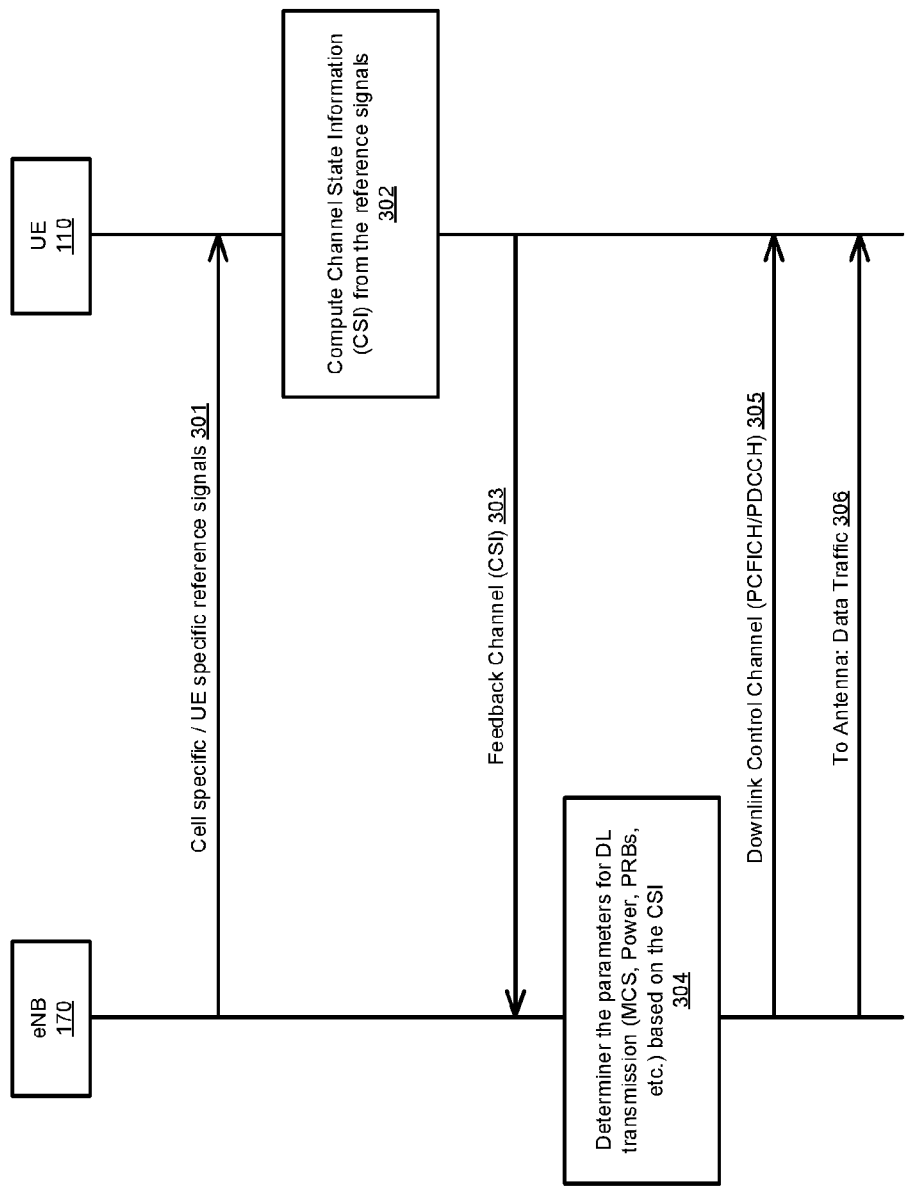
FIG. 3 illustrates a message sequence diagram between a base station and user equipment during downlink data transfer.

FIG. 3 illustrates a message sequence diagram between a base station and user equipment during downlink data transfer. Although the figure is discussed with reference to a downlink channel, it is appreciated that communication may also be in an uplink channel.

As shown, base station (eNB) 170 communicates cell-specific/UE-specific reference (or pilot) signals at 301. Downlink reference signals are predefined signals occupying specific resource elements within the downlink time-frequency grid. The LTE specification includes several types of downlink reference signals that are transmitted in different ways and used for different purposes by the receiving terminal (UE 110), including, but limited to the following.

One type of reference signal is a cell-specific reference signal (CRS), which are transmitted in every downlink subframe and in every resource block in the frequency domain, thus covering the entire cell bandwidth. The cell-specific reference signals can be used by the UE 110 for channel estimation for coherent demodulation of any downlink physical channel with a few exceptions, for example, during various transmission modes. The cell-specific reference signals can also be used by the terminal to acquire channel-state information (CSI), as explained below (302). Additionally, terminal measurements on cell-specific reference signals are used as the basis for cell-selection and handover decisions.

Another type of reference signal is a demodulation reference signal (DM-RS). These reference signals (also referred to as UE-specific reference signals) are used by UEs 110 for channel estimation for physical downlink shared channel (PDSCH) in various transmission modes.

Still another type of reference signal is a CSI reference signal (CSI-RS), which are used by UEs 110 to acquire channel-state information (CSI) in the case when demodulation reference signals are used for channel estimation. CSI-RS have a significantly lower time/frequency density, thus implying less overhead, compared to the cell-specific reference signals.

Using one or more of the above-identified reference signals, the UE 110 computes the CSI and parameters needed for CSI reporting at 302. The CSI report includes, for example, a channel quality indicator (CQI), precoding matrix index (PMI), and rank information (RI).

At 303, the CSI report is sent to the base station 170 via a feedback channel, such as a physical uplink control channel (PUCCH) for periodic CSI reporting or a physical uplink shared channel (PUSCH) for aperiodic CSI reporting. Once received, the base station 170 scheduler may use the information to choose the parameters, such as the modulation and coding scheme (MCS), power and physical resource blocks (PRBs), for scheduling of the UE 110. The base station 170 then sends the scheduling parameters to the UE 110 at 305 in the physical downlink control channel (PDCCH).

In one embodiment, before sending the parameters in the PDCCH, the base station 170 sends a control format indicator information on the physical control indicator channel (PCFICH), which is the physical channel providing the UEs 110 with information necessary to decode the set of PDCCHs. Subsequently, data transmission may occur between the base station 170 and the UE 110 at 306.

As alluded to above, the PDCCH carries information about the scheduling grants. For example, the information may include the number of MIMO layers scheduled, transport block sizes, modulation for each code word, parameters related to hybrid automatic repeat request (HARQ), subband locations and pre-coding matrix indicator (PMI) corresponding to the sub-bands. Typically, the following information is transmitted by the downlink control information (DCI) format: localized/distributed virtual resource block (VRB) assignment flag, resource block assignment, modulation and coding scheme, HARQ process number, new data indicator, redundancy version, transmit power control (TPC) command for PUCCH, a downlink assignment index, and a pre-coding matrix index and number of layers.

It is appreciated, however, that each of the DCI formats may not use all the information as detailed above. Rather, the contents of PDCCH depends on a transmission mode and the DCI format.

As discussed above, CSI may also be reported in the PUCCH in which information is carried about HARQ-ACK information corresponding to the downlink data transmission and channel state information. The channel state information may include rank indicator (RI), channel quality indicator (CQI), and PMI. Either PUCCH or PUSCH can be used to carry this information. Various modes for PUCCH and PUSCH may be used, which modes generally depend on the transmission mode and the formats configured via higher layer signaling.

Figure 4:
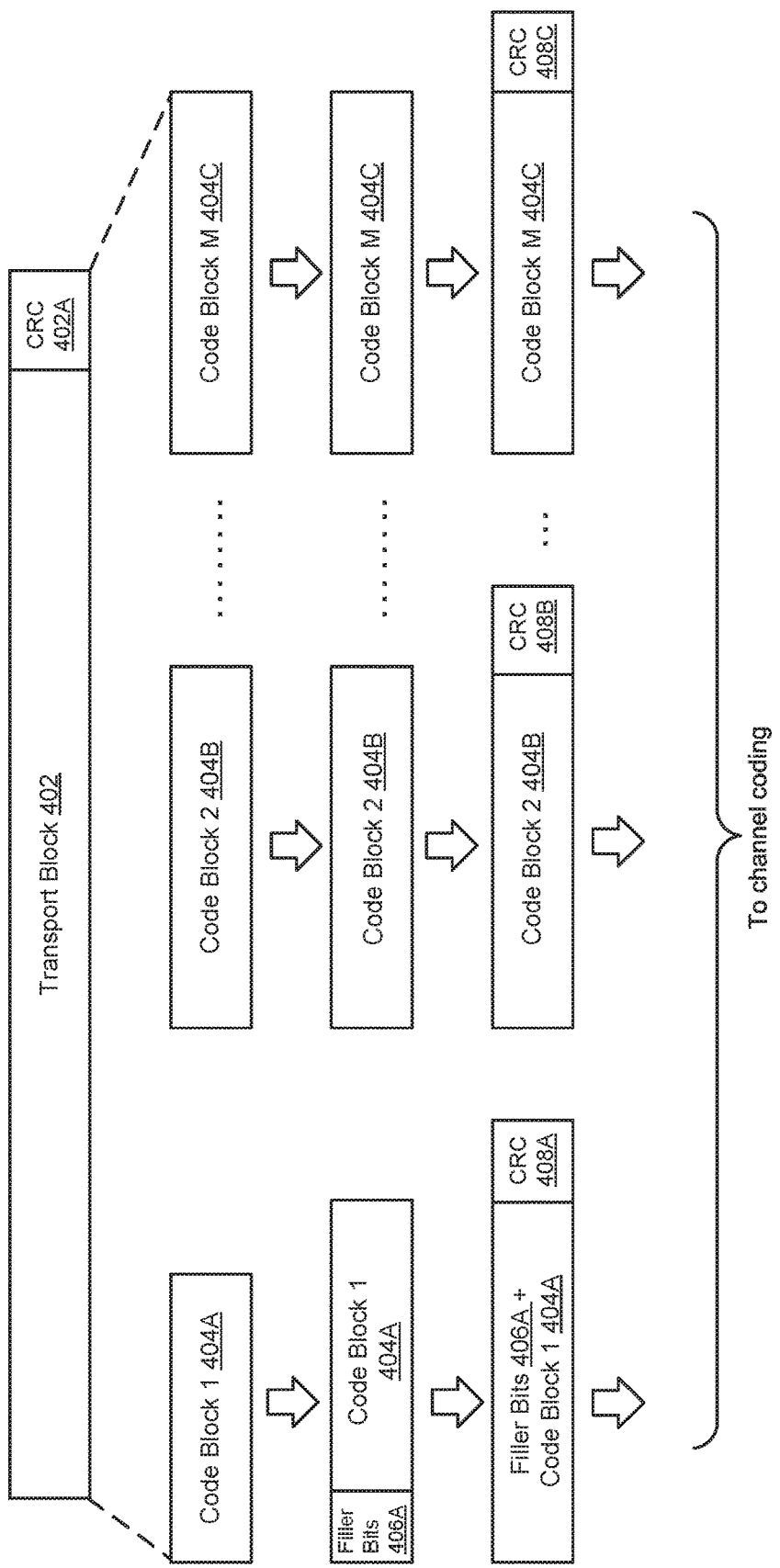
FIG. 4 illustrates an example transport block CRC and codeblock CRC according to one embodiment.

FIG. 4 illustrates an example transport block CRC and codeblock CRC according to one embodiment. In an LTE system, within a transmission time interval (TTI) (corresponding to one subframe of length 1 ms), up to two transport blocks 402 may be delivered to the physical layer and transmitted over the radio interface for each component carrier. When a transport block 402 is large, the transport block 402 may be segmented into multiple codeblocks (or codeblock segments) 404A, 404B, 404C so that multiple coded packets can be generated. During the physical layer processing, a 24-bit cyclic redundancy check (CRC) is generated for the whole transport block 402 for the purpose of error detection for that block. The CRC allows for receiver-side detection of errors in the decoded transport block 402. The corresponding error indication can, for example, be used by the downlink HARQ protocol as a trigger for requesting retransmissions.

The transport block 402 may also be segmented into codeblocks (codeblocks 404A, 404B, 404C in this example), if the transport block, including the transport-block CRC, exceeds the maximum code-block size. The codeblock 404A, 404B, 404C sizes should match the set of code-block sizes supported by the channel coder 201. In order to ensure that a transport block 402 of arbitrary size can be segmented into codeblocks that match the set of available code-block sizes, "dummy" filler bits 406A may be added to the head of the first codeblock, as illustrated.

After filler bits 406A are added to the codeblocks (if necessary), a codeblock CRC 408A, 408B, 408C is computed for each of the three codeblocks. CRC 408A is derived from the bits in codeblock 404A, CRC 408B is derived from the bits in codeblock 404B, and CRC 408C is derived from the bits in codeblock 404C. The CRC 408A can be used, for example, to stop decoding iterations or error detection for codeblock 404A, the CRC 408B can be used, for example, to stop decoding iteration or error detection for codeblock 404B, and CRC 408C can be used, for example, to stop decoding iteration and error detection for codeblock 404C. Similarly, CRC 402A provide error detection for the whole transport block 402.

It is also appreciated, for example in the case of a single codeblock when no segmentation is needed, no additional code-block CRC is applied. That is, codeblock segmentation is applied to large transport blocks for which the relative extra overhead due to the additional transport block CRC is small. Information about the transport block size is provided to the UE 110 as part of the scheduling assignment transmitted on the PDCCH control channel by the base station 170. Based on this information, the UE 110 can determine the codeblock size and number of codeblocks. The UE 110 can thus, based on the information provided in the scheduling assignment, straightforwardly undo or assemble the codeblock segmentation and recover the decoded transport blocks.

Figure 5:
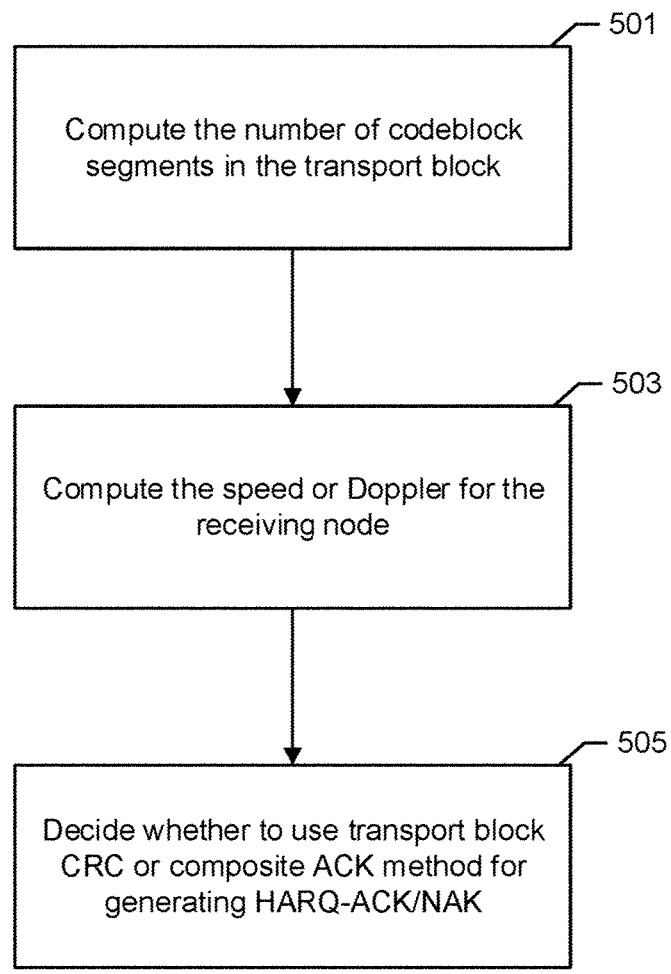
FIG. 5 illustrates a flow diagram for decoding a transport block encoded with multiple codeblock segments.

FIG. 5 illustrates a flow diagram for decoding a transport block encoded with multiple codeblock segments. The process begins at 501 with the calculation of the number of codeblock segments 404A, 404B, 404C in a transport block 402, as described above with reference to FIG. 4. Once the number of codeblock segments 404A, 404B, 404C has been calculated, the speed of the UE 110 is calculated.

The speed of a UE 110 may be calculated at 503, for example, based on one of a rate of change of channel between a base station 170 and the UE 110. In some embodiments, the speed of the UE 110 may be measured using a GPS device. In some embodiments, the speed of the UE 110 may also be measured based on Doppler shift or a time adjustment value. A time adjustment value is used, for example, to keep a UE 110 time-aligned with the serving base station 170. When a UE 110 initially accesses a radio network served by a base station 170, the UE 110 adjusts its transmission timing to be time-aligned with the base station 170. Still other embodiments may include any weft-known positioning techniques.

At 505, the UE 110 determines how to decode the transport block 402 based on the computed speed of the UE 110. For example, when the computed speed exceeds a threshold value, the UE 110 checks the CRC of the codeblock segments 404A, 404B, 404C such that it can utilize the passed codeblock segments (i.e., codeblock segments passing the CRC) 404A, 404B, 404C from prior transmissions to generate a HARQ-ACK of the transport block 402. When the computed speed is less than or equal to the threshold value, the UE 110 reports the HARQ-ACK based on the transport block CRC 402A.

As will become apparent from the description that follows, decoding received data signals in this manner reduces the number of transmission at the transmitter side (i.e., base station), and reduces processing by the receiver (i.e., UE) as well as reduce power consumption. The decision process is described in more detail with reference to FIGS. 6 and 7 that follow.

Figure 6A:
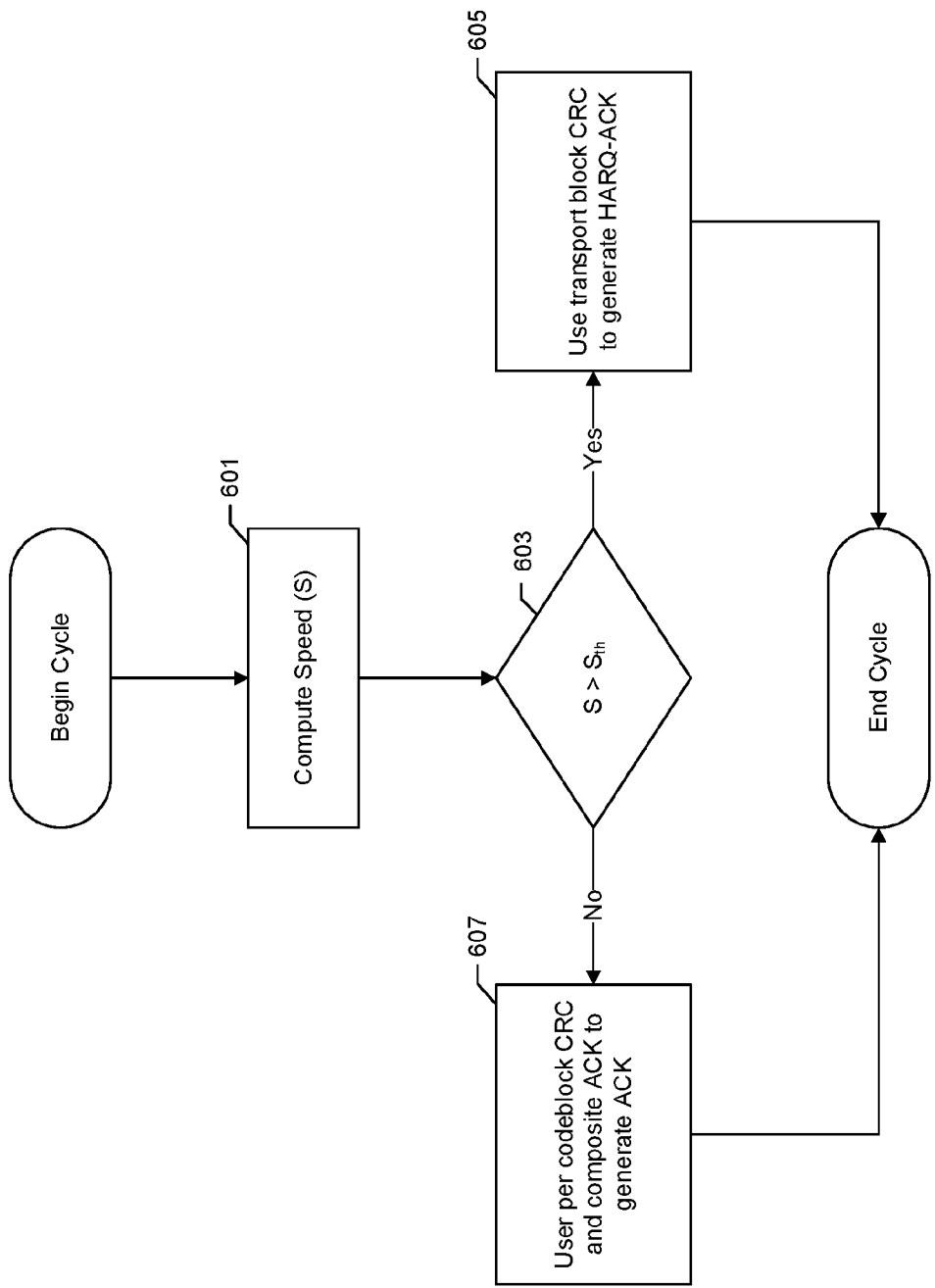
FIG. 6A illustrates a flow diagram of determining a selection between decoding procedures in accordance with FIG. 5.

FIG. 6A illustrates a flow diagram of determining a selection between decoding procedures at a receiver in accordance with FIG. 5. At 601, the speed of the UE 110 is computed, as described with above with respect to FIG. 5. Based on the determined speed (S), the UE 110 determines the procedure for decoding the received transport block 402 having been encoded with multiple codeblock segments 404A, 404B, 404C at 603.

Specifically, the UE 110 determines whether to decode one of a transport block cyclic redundancy check (CRC) and a codeblock segment CRC based on the speed (S) of the UE 110 by determining whether the speed (S) is greater than a threshold value ($S_{th}$) or less than or equal to the threshold value ($S_{th}$). If it is determined that the speed (S) of the UE 110 is greater than the threshold value ($S_{th}$), the UE 110 decodes the transport block CRC 402A and generates an HARQ-acknowledgement (ACK)/non-acknowledgement (NAK) at 605. If, on the other hand, it is determined that the speed (S) of the UE 110 is less than or equal to the value ($S_{th}$), then the UE 110 decodes on a per codeblock CRC or using a composite acknowledgment procedure to generate the HARQ-ACK/NAK at 607. The per codeblock CRC and composite acknowledgement procedures are described in more detail below with reference to FIG. 7.

Figure 6B:
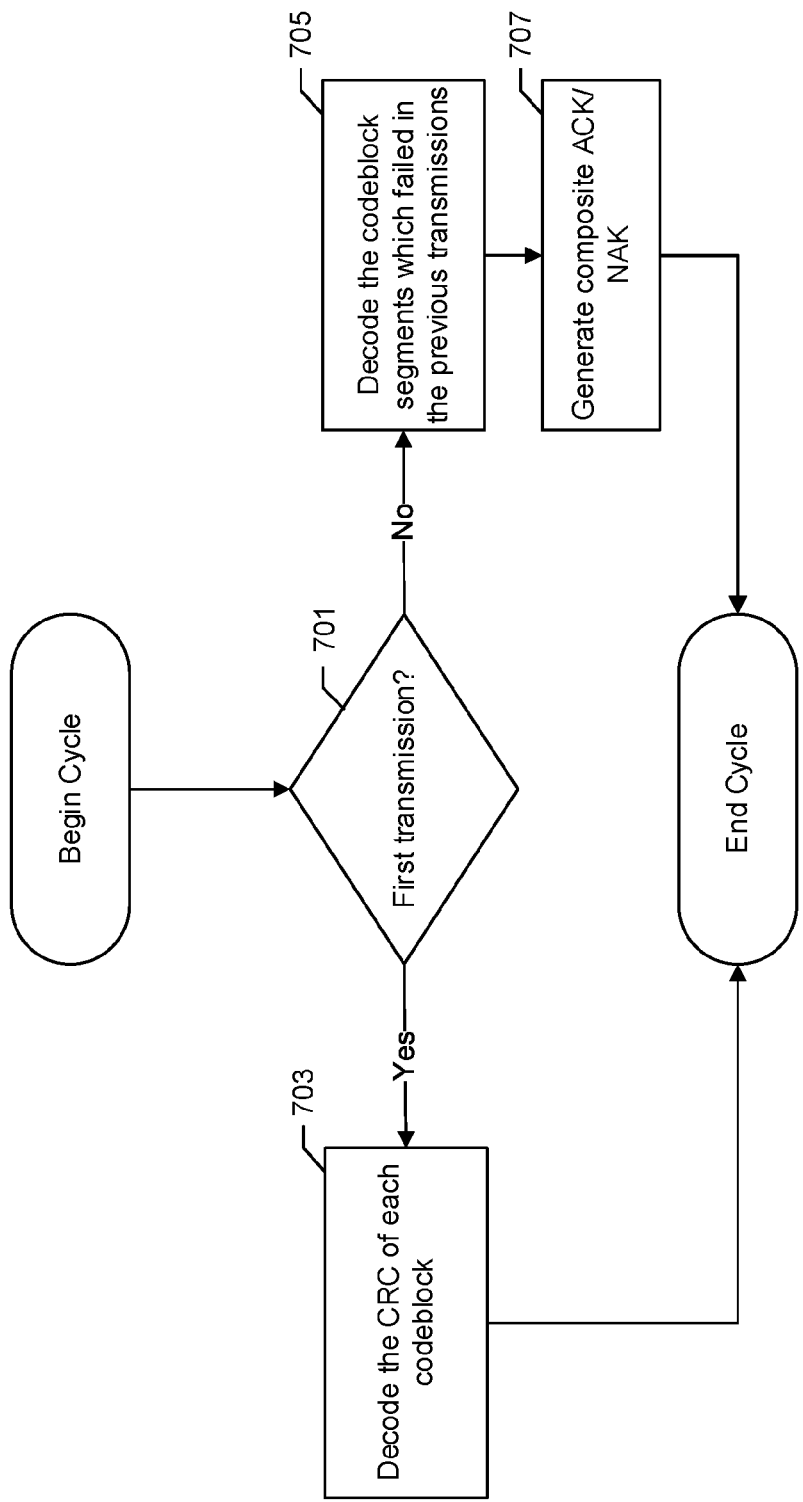
FIG. 6B illustrates a flow diagram of a decoding procedure at a receiver based on speed in accordance with FIG. 6.

FIG. 6B illustrates a flow diagram of a decoding procedure at a receiver when a UE speed is less than or equal to a threshold value in accordance with FIG. 6A. If is determined at 603 (FIG. 6A) that the speed (S) of the UE 110 is less than or equal to the value ($S_{th}$), then the UE 110 decodes on a per codeblock CRC or using a composite acknowledgment procedure to generate the HARQ-ACK/NAK, as follows.

If the UE 110 is receiving a first data transmission (i.e., first transport block transmission) as determined at 701, then UE 110 decodes the codeblock segment CRC for each of the codeblock segments 404A, 404B, 404C and generates the HARQ-ACK/NAK at 703. During subsequent data reception (i.e., not a first data transmission) as determined at 701, the UE 110 decodes the codeblock segment CRC for each of the codeblock segments 404A, 404B, 404C that failed to pass the CRC during the first data transmission at 705. The UE 110 then generates the HARQ-ACK/NAK at 707. The process described at 705 and 707 is referred to herein as a composite acknowledgment procedure (or composite ACK).

To generate the composite ACK, when the UE 110 decodes any of the codeblock segment CRCs 404A, 404B, 404C, the UE 110 will check whether any of the codeblock segments 404A, 404B, 404C have passed the CRC in previous transmissions. The UE 110 will then proceed to decode those segments which failed the CRC. Notably, this procedure reduces the decoding complexity (not every codeblock segment is decoded for each transmission).

The process to generate the HARQ—ACK/NAK is described in the following example. In the example, an ACK is denoted by "1" and a NAK is denoted by "0" for each codeblock segment. For a transport block 402 having six (6) codeblock segments, each ACK/NAK for a corresponding codeblock segment is represented by: $A_i$, $B_i$, $C_i$, $D_i$, $E_i$, and $F_i$ given a transmission number i for the first, second, third, fourth, fifth and sixth codeblock segments, respectively.

The set of codeblocks is represented according to:
$A=\{A_1 \ldots A_j\}$,
$B=\{B_1 \ldots B_j\}$,
$C=\{C_1 \ldots C_j\}$,
$D=\{D_1 \ldots D_j\}$,
$E=\{E_1 \ldots E_j\}$,
$F=\{F_1 \ldots F_j\}$,
where j indicates the $j^{th}$ transmission, and The composite ACK for HARQ-ACK/NAK is generated according to the formula:

$$\text{Composite HARQ-ACK/NAK} = \max(A)*\max(B)*\max(C)*\max(D)*\max(E)*\max(F),$$

where max( ) is the maximum value of the set.

Thus, if we consider the example of six (j=6) transmissions for each of the codeblocks A-F, where ACK=1 and NAK=0, where for the set A:
$1^{st}$ transmission=$\{1,1,1,0,0,0\}$
$2^{nd}$ transmission=$\{0,0,0,1,1,1\}$,
such that the $\max(A_1, A_2)=1$
and for the set F:
$1^{st}$ transmission=$\{0,1,1,0,0,1\}$
$2^{nd}$ transmission=$\{1,0,0,0,1,1\}$,
such that the $\max(F_1, F_2)=1$,
the following composite ACK/NAK is formed as:

$$\max(A_1,A_2)*\max(F_1,F_2)=1.$$

Accordingly, the composite ACK/NAK produces a HARQ-ACK (=1).

Figure 7A:
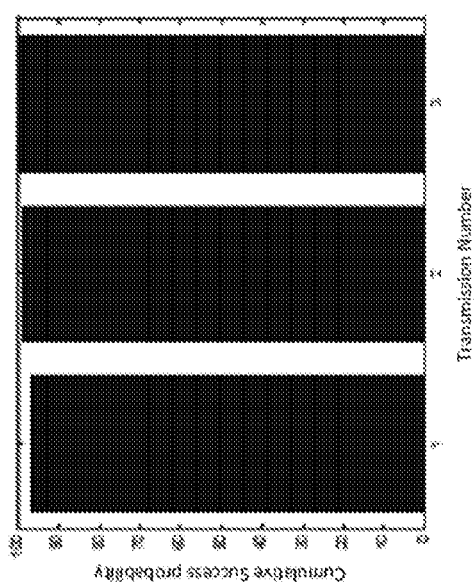
FIGS. 7A and 7B illustrate cumulative success probabilities of a transport block with varying channel speeds.
Figure 7B:
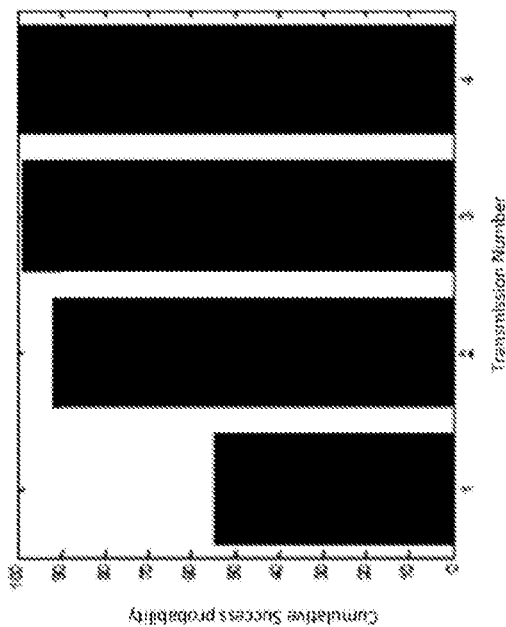

FIGS. 7A and 7B illustrate cumulative success probabilities of a transport block with varying channel speeds. FIG. 7A illustrates the cumulative success probability of a transport block for a 3 Kmph channel (e.g., slow speed). In this example, we consider a link adaptation (modulation and coding scheme) with a 10% frame error rate (FER) target. In a first transmission, more than 97% of the data packets will pass the CRC, as illustrated.

Compared to FIG. 7B, which illustrates the cumulative success probability of a transport block for 120 Kmph channel (e.g., high speed), the success probability in the first transmission is 55%, as illustrated. In this case, the UE 110 may decode the codeblock segment CRC to use the prior decisions to generate the composite HARQ-ACK during retransmissions (second and subsequent transmission).

Accordingly, as evident from the illustrations, for slow speed UEs (such as 3 Kmph), the transport block CRC is useful as most of the packets are passed in the first transmission and the UE 110 can avoid decoding of codeblock segment CRC. For high speed UEs (such as 120 Kmph), on the other hand, since most of the data packets fail in the first transmission, the decoding of codeblock segment CRC is useful as the UE 110 may use the prior decisions in decoding the transport block for retransmission.

Figure 8A:
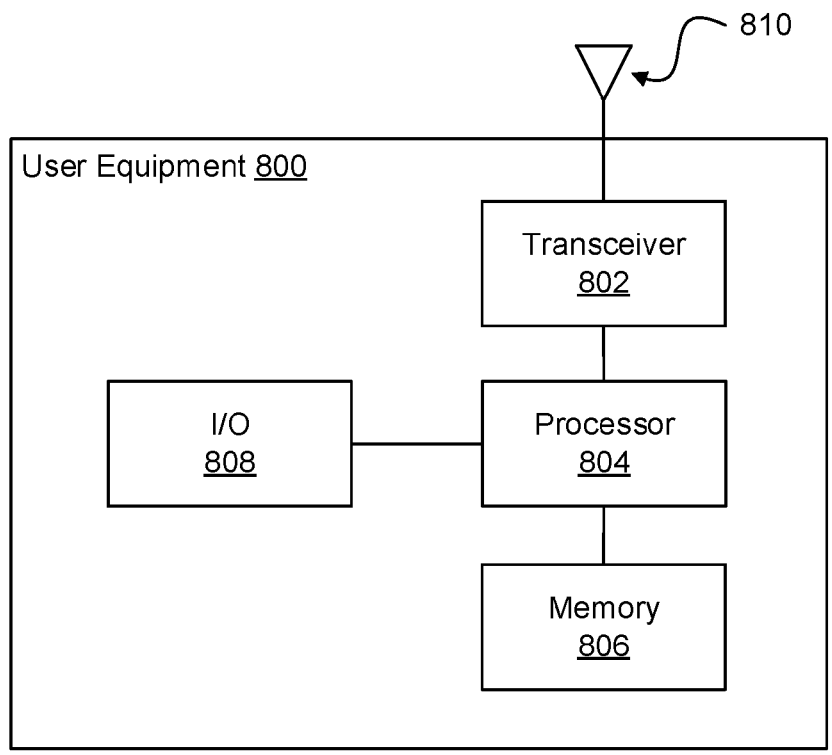
FIG. 8A illustrates example user equipment that may implement the methods and teachings according to this disclosure.

FIG. 8A illustrates example user equipment that may implement the methods and teachings according to this disclosure. As shown in the figure, the UE 800 includes at least one processor 804. The processor 804 implements various processing operations of the UE 800. For example, the processor 804 may perform signal coding, data processing, power control, input/output processing, or any other functionality enabling the UE 800 to operate in the system 100 (FIG. 1). The processor 804 may include any suitable processing or computing device configured to perform one or more operations. For example, the processor 804 may include a microprocessor, microcontroller, digital signal processor, field programmable gate array, or application specific integrated circuit.

The UE 800 also includes at least one transceiver 802. The transceiver 802 is configured to modulate data or other content for transmission by at least one antenna 810. The transceiver 802 is also configured to demodulate data or other content received by the at least one antenna 810. Each transceiver 802 may include any suitable structure for generating signals for wireless transmission and/or processing signals received wirelessly. Each antenna 810 includes any suitable structure for transmitting and/or receiving wireless signals. It is appreciated that one or multiple transceivers 802 could be used in the UE 800, and one or multiple antennas 810 could be used in the UE 800. Although shown as a single functional unit, a transceiver 802 may also be implemented using at least one transmitter and at least one separate receiver.

The UE 800 further includes one or more input/output devices 808. The input/output devices 808 facilitate interaction with a user. Each input/output device 808 includes any suitable structure for providing information to or receiving information from a user, such as a speaker, microphone, keypad, keyboard, display, or touch screen.

In addition, the UE 800 includes at least one memory 806. The memory 806 stores instructions and data used, generated, or collected by the UE 800. For example, the memory 806 could store software or firmware instructions executed by the processor(s) 804 and data used to reduce or eliminate interference in incoming signals. Each memory 806 includes any suitable volatile and/or non-volatile storage and retrieval device(s). Any suitable type of memory may be used, such as random access memory (RAM), read only memory (ROM), hard disk, optical disc, subscriber identity module (SIM) card, memory stick, secure digital (SD) memory card, and the like.

Figure 8B:
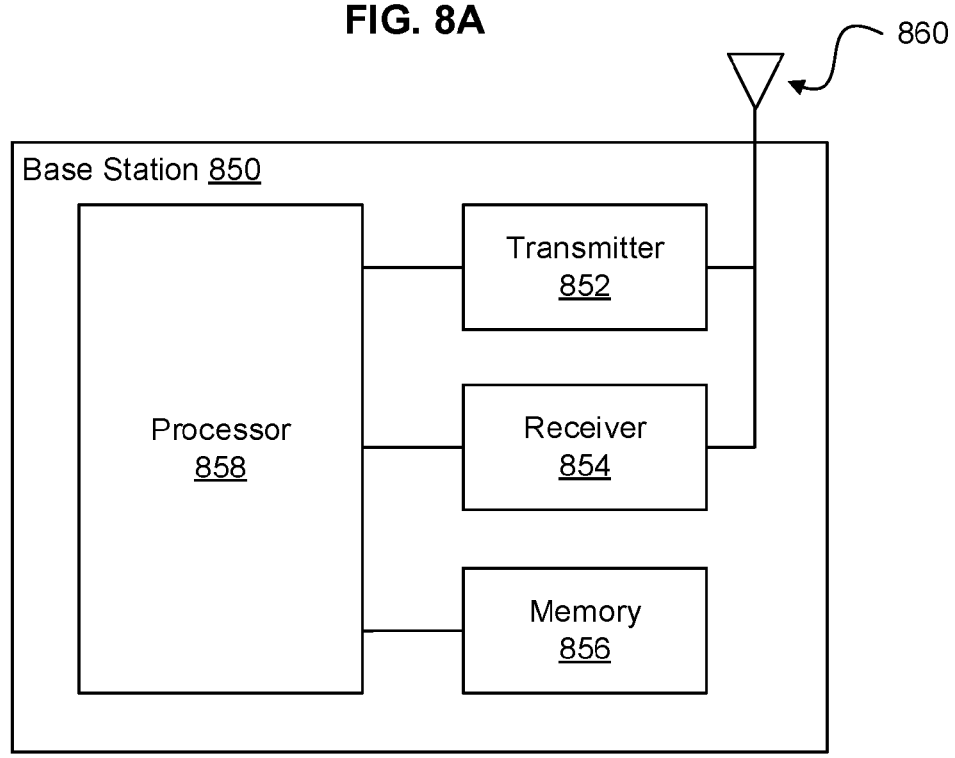
FIG. 8B illustrates example base station that may implement the methods and teachings according to this disclosure.

FIG. 8B illustrates example base station that may implement the methods and teachings according to this disclosure. As shown in the figure, the base station 850 includes at least one processor 858, at least one transmitter 852, at least one receiver 854, one or more antennas 860, and at least one memory 856. The processor 858 implements various processing operations of the base station 850, such as signal coding, data processing, power control, input/output processing, or any other functionality. Each processor 858 includes any suitable processing or computing device configured to perform one or more operations. Each processor 858 could, for example, include a microprocessor, microcontroller, digital signal processor, field programmable gate array, or application specific integrated circuit.

Each transmitter 852 includes any suitable structure for generating signals for wireless transmission to one or more UEs or other devices. Each receiver 854 includes any suitable structure for processing signals received wirelessly from one or more UEs or other devices. Although shown as separate components, at least one transmitter 852 and at least one receiver 854 could be combined into a transceiver. Each antenna 860 includes any suitable structure for transmitting and/or receiving wireless signals. While a common antenna 860 is shown here as being coupled to both the transmitter 852 and the receiver 854, one or more antennas 860 could be coupled to the transmitter(s) 852, and one or more separate antennas 860 could be coupled to the receiver(s) 854. Each memory 856 includes any suitable volatile and/or non-volatile storage and retrieval device(s).

Figure 9:
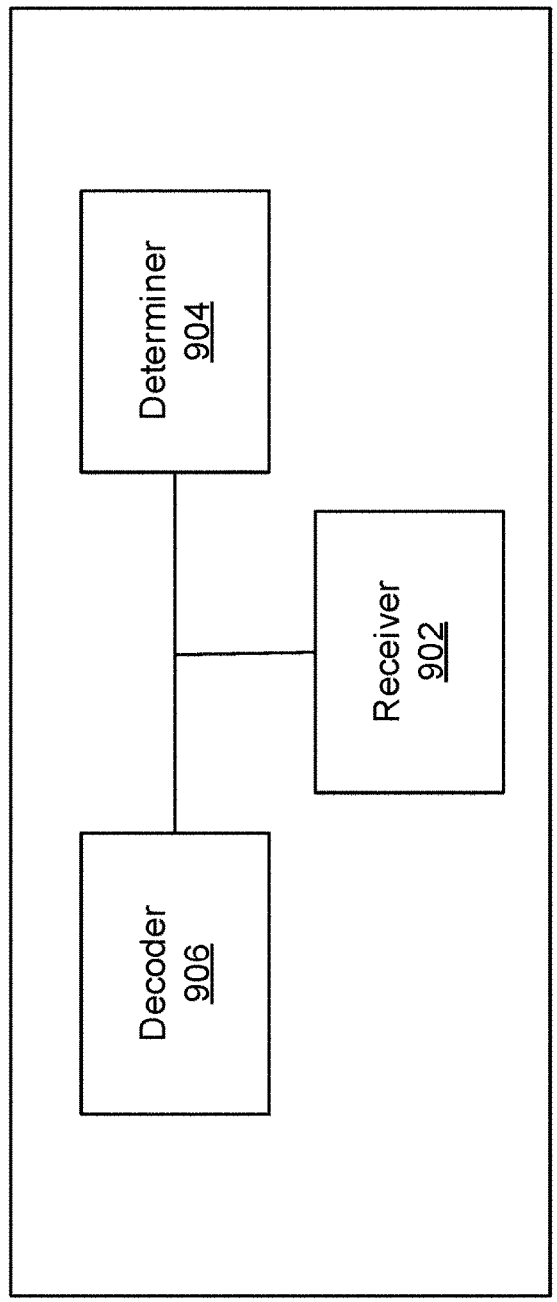
FIG. 9 is a block diagram of user equipment to decode a transport block.

FIG. 9 is a block diagram of user equipment to decode a transport block. In the example, the transport block is encoded with multiple codeblock segments. The user equipment may include, for example, a receiver 902 that receives the transport block including one of a transport block cyclic redundancy check (CRC) and a codeblock segment CRC. A determiner 904 determines whether to decode one of the CRC and the codeblock segment CRC based on a speed of user equipment. In response to the speed of the user equipment being greater than a threshold, the user equipment decodes, using decoder 906, the transport block CRC and generates an acknowledgement (ACK)/non-acknowledgement (NAK). In response to the speed of the UE being less than or equal to the threshold, for a first data transmission, the user equipment decodes, using decoder 906, the codeblock segment CRC for each of the multiple codeblock segments and generates the ACK/NAK. For second and latter data transmissions, the user equipment decodes, using decoder 906, the codeblock segment CRC for each of the multiple codeblock segments that failed in the first data transmission and generating the ACK/NAK.

Figure 10:
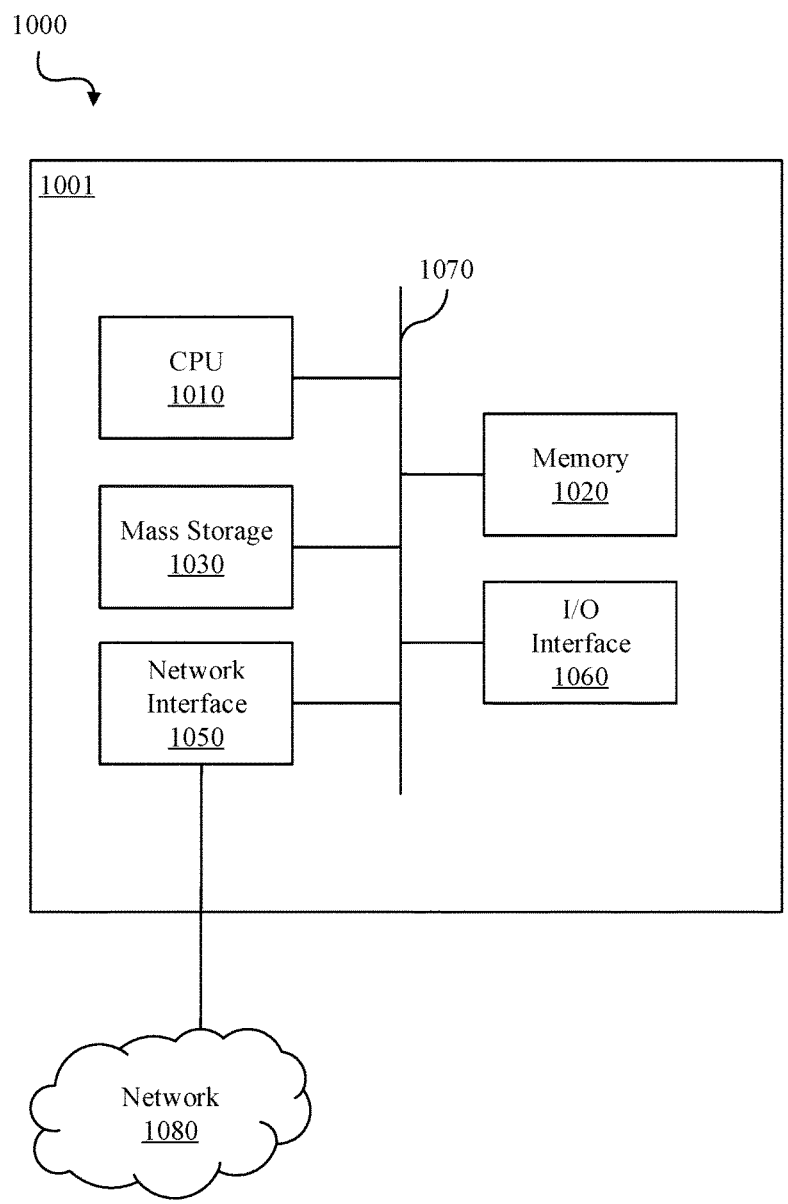
FIG. 10 illustrates a block diagram of a network system that can be used to implement various embodiments.

FIG. 10 is a block diagram of a network system that can be used to implement various embodiments. Specific devices may utilize all of the components shown, or only a subset of the components, and levels of integration may vary from device to device. Furthermore, a device may contain multiple instances of a component, such as multiple processing units, processors, memories, transmitters, receivers, etc. The network system may comprise a processing unit 1001 equipped with one or more input/output devices, such as network interfaces, storage interfaces, and the like. The processing unit 1001 may include a central processing unit (CPU) 1010, a memory 1020, a mass storage device 1030, and an I/O interface 1060 connected to a bus. The bus may be one or more of any type of several bus architectures including a memory bus or memory controller, a peripheral bus or the like.

The CPU 1010 may comprise any type of electronic data processor. The memory 1020 may comprise any type of system memory such as static random access memory (SRAM), dynamic random access memory (DRAM), synchronous DRAM (SDRAM), read-only memory (ROM), a combination thereof, or the like. In an embodiment, the memory 1020 may include ROM for use at boot-up, and DRAM for program and data storage for use while executing programs. In embodiments, the memory 1020 is non-transitory. The mass storage device 1030 may comprise any type of storage device configured to store data, programs, and other information and to make the data, programs, and other information accessible via the bus. The mass storage device 1030 may comprise, for example, one or more of a solid state drive, hard disk drive, a magnetic disk drive, an optical disk drive, or the like.

The processing unit 1001 also includes one or more network interfaces 1050, which may comprise wired links, such as an Ethernet cable or the like, and/or wireless links to access nodes or one or more networks 1080. The network interface 1050 allows the processing unit 901 to communicate with remote units via the networks 1080. For example, the network interface 1050 may provide wireless communication via one or more transmitters/transmit antennas and one or more receivers/receive antennas. In an embodiment, the processing unit 1001 is coupled to a local-area network or a wide-area network for data processing and communications with remote devices, such as other processing units, the Internet, remote storage facilities, or the like.

There are many benefits to using embodiments of the present disclosure. For example, the disclosed technology generates HARQ-ACK/NAK based on UE speed by decoding codeblock segment CRCs only or based on transport block CRC, generates a composite HARQ-ACK/NAK and generates a composite HARQ-ACK/NAK based on speed of the UE. Accordingly, the number of transmission at the transmission side is reduced and the terminal processing and corresponding energy consumption is reduced.

It is understood that the present subject matter may be embodied in many different forms and should not be construed as being limited to the embodiments set forth herein. Rather, these embodiments are provided so that this subject matter will be thorough and complete and will fully convey the disclosure to those skilled in the art. Indeed, the subject matter is intended to cover alternatives, modifications and equivalents of these embodiments, which are included within the scope and spirit of the subject matter as defined by the appended claims. Furthermore, in the following detailed description of the present subject matter, numerous specific details are set forth in order to provide a thorough understanding of the present subject matter. However, it will be clear to those of ordinary skill in the art that the present subject matter may be practiced without such specific details.

In accordance with various embodiments of the present disclosure, the methods described herein may be implemented using a hardware computer system that executes software programs. Further, in a non-limited embodiment, implementations can include distributed processing, component/object distributed processing, and parallel processing. Virtual computer system processing can be constructed to implement one or more of the methods or functionalities as described herein, and a processor described herein may be used to support a virtual processing environment.

Aspects of the present disclosure are described herein with reference to flowchart illustrations and/or block diagrams of methods, apparatuses (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

The terminology used herein is for the purpose of describing particular aspects only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The aspects of the disclosure herein were chosen and described in order to best explain the principles of the disclosure and the practical application, and to enable others of ordinary skill in the art to understand the disclosure with various modifications as are suited to the particular use contemplated.

For purposes of this document, each process associated with the disclosed technology may be performed continuously and by one or more computing devices. Each step in a process may be performed by the same or different computing devices as those used in other steps, and each step need not necessarily be performed by a single computing device.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A computer-implemented method for decoding a transport block encoded with multiple codeblock segments of a communication signal using a decoder, comprising:
   receiving, at a receiver, the transport block for transmission which includes one of a transport block cyclic redundancy check (CRC) and a codeblock segment CRC;
   computing a speed of user equipment (UE) to determine a decoding scheme based on one of the transport block CRC and the codeblock segment CRC;
   decoding, by the user equipment, the transport block CRC and generating an acknowledgement (ACK)/non-acknowledgement (NAK) in response to the speed of the user equipment being greater than a threshold;
   for a first data transmission, decoding, by the user equipment, the codeblock segment CRC for each of the multiple codeblock segments and generating the ACK/NAK in response to the speed of the UE being less than or equal to the threshold; and
   for data transmissions subsequent to the first data transmission, decoding, by the user equipment, the codeblock segment CRC for each of the multiple codeblock segments that failed to pass decoding in a previous data transmission, without decoding the codeblock segment CRC for each of the multiple codeblock segments that passed decoding in the previous data transmission, and generating the ACK/NAK based on the codeblock segment CRCs passed during the previous data transmission and during the subsequent data transmissions, in response to the speed of the UE being less than or equal to the threshold,
   wherein computing the speed of the user equipment is based on one of a rate of change of channel between a base station and the user equipment, global positioning system (GPS) and different positioning of the user equipment.

2. The computer-implemented method of claim 1, further comprising:
   determining a number of multiple codeblock segments in the transport block.

3. The computer-implemented method of claim 2, further comprising:
   determining a size of the transport block; and
   when the size of the transport block is greater than a predetermined threshold, segmenting the transport block into the multiple codeblock segments.

4. The computer-implemented method of claim 1, further comprising:
   calculating the transport block CRC for information bits to be delivered in the transport block;
   attaching the transport block CRC to the information bits to for the transport block; and
   segmenting the transport block into the multiple codeblock segments, wherein each of the codeblock segments includes a codeblock segment CRC calculated for information bits within a respective codeblock segment.

5. The computer-implemented method of claim 1, further comprising:
   receiving reference signals from a base station;
   computing channel estimates and parameters for generating a channel state information (CSI) report from the reference signals;
   sending the CSI report to the base station via a feedback channel;
   receiving scheduling parameters based on the CSI report from the base station on a downlink control channel; and
   receiving the data transmission from the base station.

6. The computer-implemented method of claim 1, wherein for the subsequent data transmissions, the ACK/NAK is generated according to the formula:

$$\max(A)*\max(B)*\max(C) \ldots *\max(N), \text{ wherein}$$

A, B, C and N each represent a respective codeblock segment,
   each codeblock segment includes j transmissions $\{N_1 \ldots N_j\}$, and
   max(N) is the maximum value of the set, wherein
   j represents the $j^{th}$ transmission and $\{N_1 \ldots N_j\}$ represent the $j^{th}$ transmissions.

7. The computer-implemented method of claim 1, further comprising transmitting each of the codeblock segments and a respective one of the codeblock segment CRCs in an uplink communication transmission by the user equipment.

8. The computer-implemented method of claim 1, further comprising transmitting each of the codeblock segments and a respective one of the codeblock segment CRCs in a downlink communication transmission by the base station.

9. The computer-implemented method of claim 1, wherein for the subsequent data transmissions, the ACK/NAK is generated by multiplying a maximum value of a set of each codeblock segment in the transport block.

10. A non-transitory computer-readable medium storing computer instructions for receiving and decoding a transport block encoded with multiple codeblock segments of a communication signal using a decoder, that when executed by one or more processors, causes the one or more processors to perform the steps of:
- receiving the transport block for transmission which includes one of a transport block cyclic redundancy check (CRC) and a codeblock segment CRC;
- computing a speed of user equipment (UE) to determine a decoding scheme based on one of the transport block CRC and the codeblock segment CRC;
- decoding, by the user equipment, the transport block CRC and generating an acknowledgement (ACK)/non-acknowledgement (NAK) in response to the speed of the user equipment being greater than a threshold;
- for a first data transmission, decoding, by the user equipment, the codeblock segment CRC for each of the multiple codeblock segments and generating the ACK/NAK in response to the speed of the UE being less than or equal to the threshold; and
- for data transmissions subsequent to the first data transmission, decoding, by the user equipment, the codeblock segment CRC for each of the multiple codeblock segments that failed to pass decoding in a previous data transmission, without decoding the codeblock segment CRC for each of the multiple codeblock segments that passed decoding in the previous data transmission, and generating the ACK/NAK based on the codeblock segment CRCs passed during the previous data transmission and during the subsequent data transmissions, in response to the speed of the UE being less than or equal to the threshold,
- wherein computing the speed of the user equipment is based on one of a rate of change of channel between a base station and the user equipment, global positioning system (GPS) and different positioning of the user equipment.

11. The non-transitory computer-readable medium of claim 10, including computer instructions to prompt the one or more processors to further perform the steps of:
- determining a number of multiple codeblock segments in the transport block.

12. The non-transitory computer-readable medium of claim 11, including computer instructions to prompt the one or more processors to further perform the steps of:
- determining a size of the transport block; and
- when the size of the transport block is greater than a predetermined threshold, segmenting the transport block into the multiple codeblock segments.

13. The non-transitory computer-readable medium of claim 10, including computer instructions to prompt the one or more processors to further perform the steps of:
- calculating the transport block CRC for information bits to be delivered in the transport block;
- attaching the transport block CRC to the information bits to for the transport block; and
- segmenting the transport block into the multiple codeblock segments, wherein each of the codeblock segments includes a codeblock segment CRC calculated for information bits within a respective codeblock segment.

14. The non-transitory computer-readable medium of claim 10, including computer instructions to prompt the one or more processors to further perform the steps of:
- receiving reference signals from a base station;
- computing channel estimates and parameters for generating a channel state information (CSI) report from the reference signals;
- sending the CSI report to the base station via a feedback channel;
- receiving scheduling parameters based on the CSI report from the base station on a downlink control channel; and
- receiving the data transmission from the base station.

15. The non-transitory computer-readable medium of claim 10, including computer instructions to prompt the one or more processors to further perform the steps of, for the subsequent data transmissions, generate the ACK/NAK according to the formula:

$$\max(A)*\max(B)*\max(C)\ldots*\max(N), \text{ wherein}$$

A, B, C and N each represent a respective codeblock segment,
each codeblock segment includes j transmissions $\{N_1 \ldots N_j\}$, and
max(N) is the maximum value of the set, wherein
j represents the $j^{th}$ transmission and $\{N_1 \ldots N_j\}$ represent the $j^{th}$ transmissions.

16. The non-transitory computer-readable medium of claim 10, including computer instructions to prompt the one or more processors to further perform the steps of transmitting each of the codeblock segments and a respective one of the codeblock segment CRCs in an uplink communication transmission by the user equipment.

17. The non-transitory computer-readable medium of claim 10, including computer instructions to prompt the one or more processors to further perform the steps of transmitting each of the codeblock segments and a respective one of the codeblock segment CRCs in a downlink communication transmission by the base station.

18. A user equipment for decoding a transport block encoded with multiple codeblock segments of a communication signal using a decoder, comprising:
a memory storage comprising instructions; and
one or more processors coupled to the memory that execute the instructions to:
- receive the transport block for transmission which includes one of a transport block cyclic redundancy check (CRC) and a codeblock segment CRC;
- compute a speed of user equipment (UE) to determine a decoding scheme based on one of the transport block CRC and the codeblock segment CRC;
- decode, by the user equipment, the transport block CRC and generate an acknowledgement (ACK)/non-acknowledgement (NAK) in response to the speed of the user equipment being greater than a threshold;
- for a first data transmission, decode, by the user equipment, the codeblock segment CRC for each of the multiple codeblock segments and generate the ACK/NAK in response to the speed of the UE being less than or equal to the threshold; and
- for data transmissions subsequent to the first data transmission, decode, by the user equipment, the codeblock segment CRC for each of the multiple codeblock segments that failed to pass decoding in a previous data transmission, without decoding the codeblock segment CRC for each of the multiple codeblock segments that passed decoding in the previous data transmission, and generate the ACK/NAK based on the codeblock segment CRCs passed during the previous data transmission and during the subsequent data transmissions, in response to the speed of the UE being less than or equal to the threshold, wherein the compute the speed of the user equipment is based on one of a rate of change of channel between a base station and the user equipment, global positioning system (GPS) and different positioning of the user equipment.

19. The user equipment of claim 18, wherein the one or more processors coupled to the memory further execute the instructions to:
the instructions to determine a number of multiple codeblock segments in the transport block.

20. The user equipment of claim 19, wherein the one or more processors coupled to the memory further execute the instructions to:
determine a size of the transport block; and
when the size of the transport block is greater than a predetermined threshold, segment the transport block into the multiple codeblock segments.

21. The user equipment of claim 18, wherein during subsequent data transmissions, the ACK/NAK is generated according to the formula:

$$\max(A)*\max(B)*\max(C) \ldots *\max(N), \text{ wherein}$$

A, B, C and N each represent a respective codeblock segment,
each codeblock segment includes j transmissions $\{N_1 \ldots N_j\}$, and
max(N) is the maximum value of the set, wherein
j represents the $j^{th}$ transmission and $\{N_1 \ldots N_j\}$ represent the $j^{th}$ transmissions.

* * * * *